(12) United States Patent
Reuter

(10) Patent No.: US 6,191,522 B1
(45) Date of Patent: Feb. 20, 2001

(54) PIEZOELECTRIC ACTUATOR WITH LOW STRESS ELECTRODES

(75) Inventor: Martin Reuter, Dachau (DE)

(73) Assignee: marco Systemanalyse und Entwicklung GmbH, Dachau (DE)

(*) Notice: Under 35 U.S.C. 154(b), the term of this patent shall be extended for 0 days.

(21) Appl. No.: 09/269,960

(22) PCT Filed: Nov. 11, 1997

(86) PCT No.: PCT/EP97/06266

§ 371 Date: Apr. 8, 1999

§ 102(e) Date: Apr. 8, 1999

(87) PCT Pub. No.: WO98/21759

PCT Pub. Date: May 22, 1998

(30) Foreign Application Priority Data

Nov. 12, 1996 (DE) .............................................. 196 46 511

(51) Int. Cl.[7] .................................................. H01L 41/083
(52) U.S. Cl. ........................................... 310/328; 310/366
(58) Field of Search ................................... 310/365, 366, 310/328

(56) References Cited

U.S. PATENT DOCUMENTS

| 4,639,630 | 1/1987 | Rodloff et al. | 310/328 |
| 5,233,260 | * 8/1993 | Harada et al. | 310/328 |
| 5,237,239 | * 8/1993 | Inoue et al. | 310/328 |
| 5,245,734 | * 9/1993 | Issartel | 29/25.35 |
| 5,834,879 | * 11/1998 | Watanabe et al. | 310/328 |
| 5,912,526 | * 6/1999 | Okawa et al. | 310/328 |

* cited by examiner

Primary Examiner—Thomas M. Dougherty
(74) Attorney, Agent, or Firm—Jordan and Hamburg LLP

(57) ABSTRACT

The present invention relates to a piezo-electric torque actuator with low stress electrodes. The present invention is specially used to produce tilting motions in high frequency ranges. The invention provides for forming a piezo-electric stack element with required external electrical connection contacts with a substantially reduced mechanical load and which direct tilting motions without required additional means for motion transformation. The present invention is formed of at least two areas of piezo-electric stacks, and an area arranged there between which contains segments that are affect only partially or are unaffect by an electrical field generated by the flat laminate contacts. This is accomplished by disposing external electrode connections of the two areas as far as possible in the direction of field-reduced or field-free areas, wherein the in between area is connected with the two areas (1 and 2) at least in positive fit.

14 Claims, 2 Drawing Sheets

PIEZOELECTRIC ACTUATOR WITH LOW STRESS ELECTRODES

BACKGROUND OF THE INVENTION

The invention relates to a piezoelectric torque actuator with low stress electrodes which is particularly used to produce tilting motions in high-frequency ranges.

Piezoelectric driving and adjusting elements are already known. The driving and adjusting elements, respectively, underlying the present invention, are of the kind employing piezoelectric stack drives as actuating elements. Such drives and their advantages are described in detail, for example, in Vol. 104, F&M Feinwerktechnik, Mikrotechnik, MeBtechnik, (Carl Hanser Publishing House Munich 1996), pg. 68ff. Such a drive is also described in DE 44 45 642 A1, in which narrowly adjacent piezoelectric double 15 stacks are employed and which can be used to realize many different drive operations. A general disadvantage of all known stack drives lies in the fact that the external electric stack contacts required (refer to, for example, DE 42 24 284 A1) are subject to considerable mechanical load both, in statical and in dynamical operation. The stacks are formed of a plurality of superimposed piezoelectric foils which are connected to one another. Each of the foils are provided with flat contacts on both faces of each foil. The external contact for the individual foils with each other is effected by having an electrode pass through, in particular a solder layer, on the respective opposing longitudinal sides of the stacks. Such electrodes, but also the field-free interactive insulation ranges, are subject to the most extreme mechanical and electric stress during the expansions and contractions of the stacks. When these stacks are operated by pulsed currents in the ampere range and at frequencies in the kHz-range, conventional stacks undergo expansions of 1–2% which distinctly limits the stress cycles to less than 109.

A further disadvantage of the known drives is the considerable mechanical expenditures which are required to convert the pure translatory motions produced by the stacks into tilting motions (refer to, for example, DE 44 45 642 A1 or EP 0 574 945 A1).

Furthermore, the prior art discloses designs for other applications. So, for example, DE 196 05 214 A1 describes an ultra-sonic drive element which typically operates at frequencies of greater than (>) 20 kHz. In this mode of operation only very small lifting motions occur and therefore there are low mechanical expansions of the external contacts as a result there is no need for any special description as to the arrangement of the electrodes in the referred to disclosure.

SUMMARY OF THE INVENTION

It is an object of the present invention to provide a piezoelectric driving or adjusting element of laminated structure operated in the $d_{33}$–mode. The required electric connection contacts of the structure is subject to a substantially reduced mechanical stress and, in particular, results in direct tilting motions without any further means for motion transformation.

The object of the invention is realized by the features described herein.

The essential feature of the invention resides in a stack of a laminated structure formed of a first range and a second range, both made of piezoelectric active, in particular, piezoceramic material with an in-between third range, the latter includes areas which are not covered by an electric field originating from the voltage applied across the flat laminate contacts; the external electrode connections of the two piezoelectrically active ranges are substantially displaced in direction of the mentioned field-free areas, wherein the third range is at least in positive fit, preferably in material fit, illustrates to the first and second range.

BRIEF DESCRIPTION OF THE DRAWINGS

The invention will be explained hereinafter in more detail by virtue of the embodiments illustrated in the accompanying drawings in which.

DETAILED DESCRIPTION OF THE INVENTION

Figure 1:
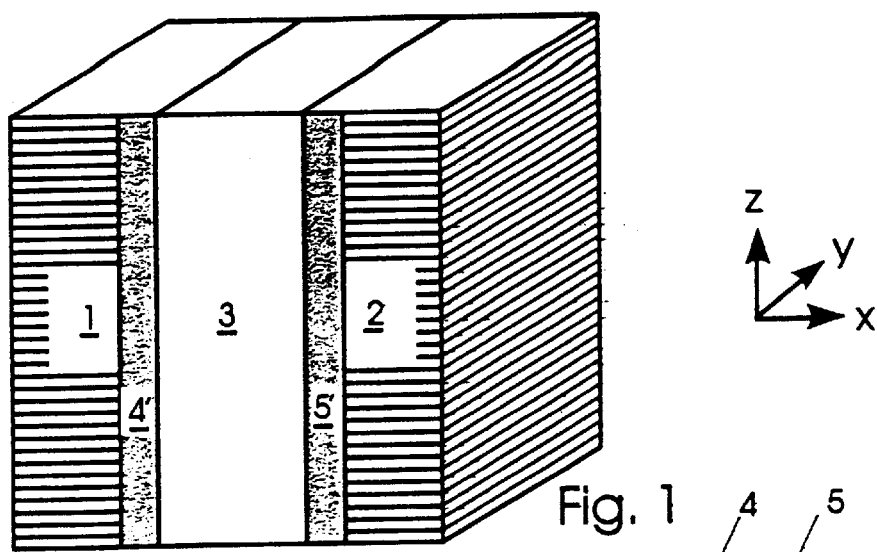
FIG. 1 illustrates a first schematical setup of the invention illustrating an piezoelectrically actuated driving or adjusting element.

Referring now to the drawings, FIG. 1 discloses a general setup of the present invention which is represented in perspective view. The drive includes two piezoelectric stacks which are formed of a plurality of superimposed piezoceramic laminae connected to one another, each of laminae being provided with flat contacting coverages on both its respective sides in the x-y-plane. Between the two stacks and form-locked to the same is interposed a range 3, the lateral areas of which are congruent to the respective closely adjacent lateral faces of the stack ranges 1, 2. The external contacting of the individual laminae electrodes terminate in the stack leading face by means of electrodes 4 (4) and 5 (5) which capture the entire stack, for example, via a soldered and sputtered contact layer. According to the invention the electrodes 4 (4) and 5'(5) are, however, substantially displaced into and located in the piezoelectrically passive range 3.

Figure 2:
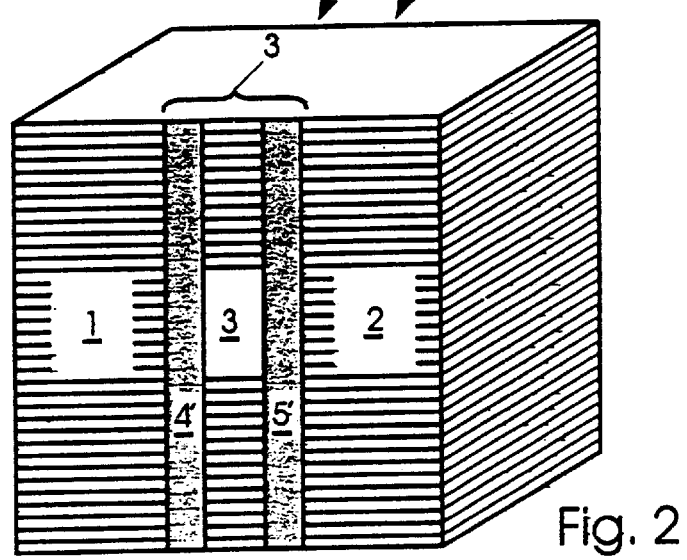
FIG. 2 illustrates a preferred embodiment according to FIG. 1.
Figure 3:
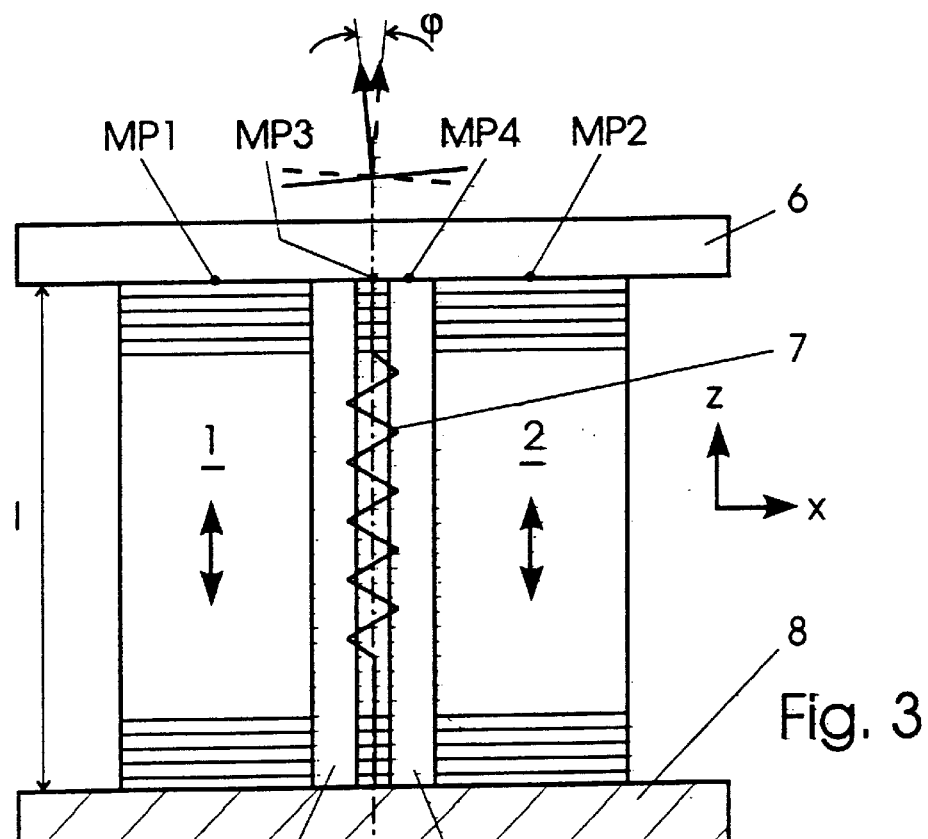
FIG. 3 illustrates a preferred application of an embodiment according to FIG. 2 for, for example, a tilting-reflector drive.
Figure 4:
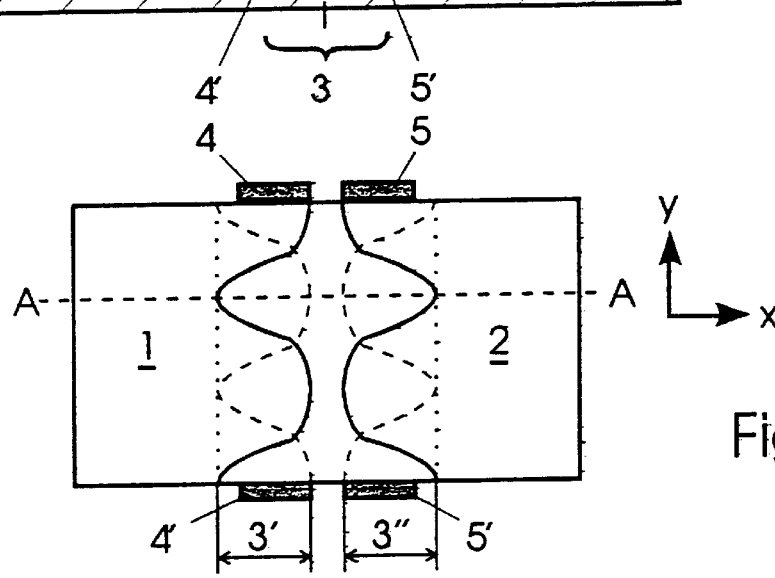
FIG. 4 illustrates a preferred embodiment of the individual flat laminate electrodes according to the invention.
Figure 5:
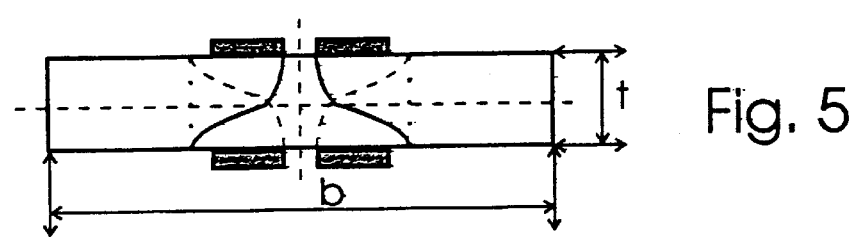
FIG. 5 illustrates a smallest stack-width producible from an embodiment according to FIG. 4.

Preferably, within the scope of the invention,, as shown in FIG. 2, the ranges 1, 2, and 3 are formed of an integral stack of respective non-divided laminae which cover the entire area of the ranges 1, 3, 2, in which a special electrode structure forms a piezoelectrically passive range 3 which is described in more detail in FIGS. 4, 5, 6, and 7. With such an embodiment it is possible to have a complete displacement of the external electrodes 4, 5 within the range 3 that is substantially piezoelectrically passive. An embodiment of the invention will be described in more detail in connection with FIG. 3 which schematically represents a feasible application of a tilting-reflector drive. The shown stack with its ranges 1, 2, 3 will be formed of 160 piezoceramic foils of a thickness of 100 μm. The individual foils are provided with periodically recurrent contact structures on both of their faces, as shown in FIG. 4 in more detail. The foils are stacked one above the other and joined in such a manner that the contact structures of adjacent foils are congruently superimposed and form a common flat electrode. By separation with a separating saw at right angles to the planes of the flat electrodes (refer to the separation line A—A in FIG. 4) the cross-sectional geometry as shown in FIG. 5 results in the smallest possible unit. When lined up with metal 4, 4 and 5, 5' in the separation plane, the electrode coverage of the ranges 1 and 2 on both faces are contacted with one another so that even-numbered and uneven-numbered contact planes are electrically connected to each other. By applying a voltage of 200V across the electrodes 4 and;4, as well as 5 and 5 the piezolaminae are polarized in those ranges where the even-numbered and the uneven-numbered contact planes cover one another. Thus, a configuration is obtained in the piezoelectric active external ranges 1 and 2, and in the piezoelectric passive internal range 3 between the transitional ranges 3' and 3. The external electrical connections 4, 4, and 5, 5 are made by soldered connections of the four metal linings to four connection wires (not shown). The actuator obtained in such manner has a geometry of l=16 mm, b=14 mm, and t=2.5 mm. Due to the periodicity of the contact structures, the uneven-numbered multiples of the depth t are also operable (refer to FIG. 5). The actuator such provided is generally operable in two modes of operation, wherein the first mode of operation described hereinafter is the most preferable one according to the present invention.

1st mode of operation: A voltage is applied having antisymmetrical voltage changes across range 1 of from 0–200V and across a range 2 of 200–0 V, respectively; 2nd mode of operation: A voltage is applied having symmetrical voltage changes across ranges 1 and 2 between 0–200 V.

The following length variations are measured at the measuring points MP1 to MP4 shown in FIG. 3:

|  | MP1 | MP2 | MP3 | MP4 |
| --- | --- | --- | --- | --- |
| operation mode 1 | 17.7 μm | 17.9 μm | 0.5 μm | 6 μm |
| operation mode 2 | 16.0 μm | 16.5 μm | 12.5 μm | 11 μm | wherein the respective given changes in length are representative of the respective maximal lifts with measuring tolerances in the individual ranges.

The operation mode 1 yields a great antisymmetrical change in length in the range of the measuring points 1 and 2. In the axis of symmetry, at the measuring point MP3 there is substantially no change in length. In the range of the external connections 4, 4, and 5, 5 (MP4) the change in length is reduced to about one third and, therefore, very strong compared with the changes in length in the ranges 1 and 2 (MP1, MP2). The tiltings of the surface taken by the measurements amount to ±0.11°. Such a drive permits, for example, operating a tilting-reflector, the deviations of which occur a pressure plate 6 which is of low mass and resistant to bending,are indicated in FIG. 3.

The operation mode 2 yields a symmetrical expansion of 1% of the length with a slightly reduced expansion in the range 3 (MP3 and MP4). Thus it is also possible to operate the present invention actuator as a single actuator setup according to the state of art.

When this stack includes a pressure plate 6 of low mass, resistant to bending and connected to a base plate 8 via tensioning means 7,it is pre-stressed by a symmetrical acting force of about 800N which permits tiltings about an axis of symmetry or lifts, then the maximal tilting angle is increased to l=±0.2° and the attainable lift in z-direction to 28 μm, respectively. Such an arrangement exhibits a very high resonant frequency of about 20 kHz in both operation modes. Further feasible modifications of the flat electrode embodiments with respect to range 3 are schematically indicated in FIGS. 6 and 7.

Figure 6:
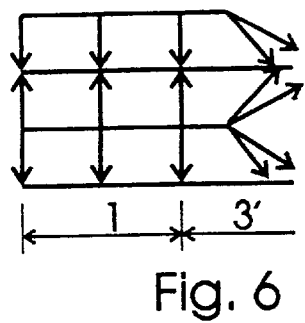
FIGS. 6 and 7 illustrate further variations and modifications of embodiments of laminate flat electrodes.

In FIG. 6 there are shown in x-direction alternating, positive and negative electrodes of different lengths of contact layer formations so that the electric field decreases in the range 3' (and in the range 3", respectively (not visible) ) leading to a lower expansion of these ranges.

Figure 7:
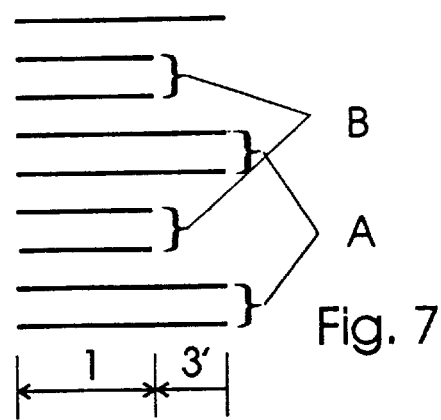

FIG. 7 illustrates electrode formations in which contacted slice ranges (A) in the transitional range 3 are alternatingly provided with non-contacted slice ranges (B) in the range 3'. The sequence of the decrease of the electrically effective field in the transitional range 3' (and in the range 3", respectively, neither visible therein) is analogous to what is described in FIG. 6. Further variations for different embodied electrodes in the x-direction lie within the scope of the invention.

What is claimed is:

1. A piezoelectric actuator comprising:

first and second piezoelectric stacks each including:

piezoelectric laminae disposed stacked upon one another to form a stack having a stack axis extending from a stack bottom to a stack top in a z-direction of said stack, said stack having opposing front and back sides displaced apart in a y-direction, and opposing first and second lateral sides displaced apart in an x-direction; and electrode layers interposed between said piezoelectric laminae, said electrode layers including first potential electrodes and second potential electrodes disposed to provide electrical contact on opposing faces of said laminae for application of an electric field across a thickness of said piezoelectric laminae to effect extension and contraction of said stack substantially in a direction of said stack axis due to is piezoelectric activity of said stack;

an interconnecting member interposed between and interconnecting said first and second piezoelectric stacks thereby providing a positive mechanical connection between said first lateral sides of said first and second piezoelectric stacks, said interconnecting member having front and back surfaces spaced apart in said y-direction;

said first potential electrodes extending from said first lateral sides laterally in the x-direction into said interconnecting member a minimum distance at a first position along the y-direction and a maximum distance at a second position along the y-direction;

said second potential electrodes extending laterally in the x-direction into said interconnecting member a minimum distance at a third position along the y-direction and a maximum distance at a fourth position along the y-direction, said fourth position being displaced in the y-direction from said second position thereby reducing overlap of said first potential electrodes and said second potential electrodes in said interconnecting member and reducing a resultant piezoelectric activity in said interconnecting member relative to said piezoelectric activity of said stacks;

a first electrical interconnector interconnecting said first potential electrodes; and a second electrical interconnector interconnecting said second potential electrodes.

2. The piezoelectric actuator of claim 1 wherein said piezoelectric laminae of said first and second piezoelectric stacks are contiguous between said first and second piezoelectric stacks and thereby form said interconnecting member.

3. The piezoelectric actuator of claim 2 wherein said first position coincides along the y-direction with said fourth position, and said second position coincides along the y-direction with said third position.

4. The piezoelectric actuator of claim 3 wherein:

said first potential electrodes extend laterally in the x-direction into said interconnecting member a distance which varies in a first periodic pattern along the y-direction;

said second potential electrodes extend laterally in the x-direction into said interconnecting member a distance which varies in a second periodic pattern along the y-direction; and said first period pattern is shifted substantially 180° relative to said second period pattern.

5. The piezoelectric actuator of claim 4 wherein:

said first and second periodic patterns have equal period distances; and said first and second piezoelectric stacks have said opposing front and back sides displaced apart in a distance in the y-direction equal to an odd number of half periods of said first and second periodic patterns.

6. The piezoelectric actuator of claim 5 wherein said first position and said fourth position coincide with one of said front surface and said back surface of said interconnecting member.

7. The piezoelectric actuator of claim 6 wherein:

said first electrical interconnector extends along one of said front surface and said back surface of said interconnecting member interconnecting said first potential electrodes; and said second electrical interconnector extends along another one of said front surface and said back surface of said interconnecting member interconnecting said second potential electrodes.

8. The piezoelectric actuator of claim 1 wherein:

said first potential electrodes extend laterally in the x-direction into said interconnecting member a distance which varies in a first periodic pattern along the y-direction;

said second potential electrodes extend laterally in the x-direction into said interconnecting member a distance which varies in a second periodic pattern along the y-direction; and said first period pattern is shifted substantially 180° relative to said second period pattern.

9. The piezoelectric actuator claim 8 wherein said first position coincides along the y-direction with said fourth position, and said second position coincides along the y-direction with said third position.

10. The piezoelectric actuator of claim 9 wherein:

said first and second periodic patterns have equal period distances; and said first and second piexoelectric stacks have said opposing front and back sides displaced apart in a distance in the y-direction equal to an odd number of half periods of said first and second periodic patterns.

11. The piezoelectric acutator of claim 10 wherein said first position and said front surface and said back surface of said interconnecting member.

12. The piezoelectric actuator of claim 1 wherein said first position coincides along the y-direction with said fourth position, and said second position coincides along the y-direction with said third position.

13. The piezoelectric actuator of claim 12 wherein:

said first position and said fourth position coincide with one of said front surface and said back surface of said interconnecting member; and said second position and said third position coincide with another one of said front surface and said back surface of said interconnecting member.

14. The piezoelectric actuator of claim 13 wherein:

said first electrical interconnector extends along said another one of said front surface and said back surface of said interconnecting member interconnecting said first potential electrodes; and said second electrical interconnector extends along said one of said front surface and said back surface of said interconnecting member interconnecting said second potential electrodes.

* * * * *